US011538871B2

United States Patent
Liu et al.

(10) Patent No.: US 11,538,871 B2
(45) Date of Patent: Dec. 27, 2022

(54) ARRAY SUBSTRATE AND FABRICATING METHOD THEREOF, AND DISPLAY APPARATUS

(71) Applicant: BOE TECHNOLOGY GROUP CO., LTD., Beijing (CN)

(72) Inventors: Qingzhao Liu, Beijing (CN); Guoqiang Wang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 190 days.

(21) Appl. No.: 16/763,786

(22) PCT Filed: Oct. 31, 2019

(86) PCT No.: PCT/CN2019/114784
§ 371 (c)(1),
(2) Date: May 13, 2020

(87) PCT Pub. No.: WO2020/192117
PCT Pub. Date: Oct. 1, 2020

(65) Prior Publication Data
US 2021/0233972 A1    Jul. 29, 2021

(30) Foreign Application Priority Data

Mar. 28, 2019 (CN) .......................... 201910242276.3

(51) Int. Cl.
*H01L 27/32* (2006.01)
*H01L 51/56* (2006.01)

(52) U.S. Cl.
CPC ...... *H01L 27/3227* (2013.01); *H01L 27/3246* (2013.01); *H01L 51/56* (2013.01)

(58) Field of Classification Search
CPC .. H01L 27/3227; H01L 27/3246; H01L 51/56
(Continued)

(56) References Cited

U.S. PATENT DOCUMENTS

2015/0364527 A1* 12/2015 Wang ................... H01L 27/326
257/40
2016/0155782 A1* 6/2016 Sato .................... H01L 27/3227
257/82

(Continued)

FOREIGN PATENT DOCUMENTS

| CN | 101276790 A | 10/2008 |
|---|---|---|
| CN | 106708326 A | 5/2017 |

(Continued)

OTHER PUBLICATIONS

English Machine Translation of CN 109065582 (Year: 2018).*
(Continued)

*Primary Examiner* — Dzung Tran
(74) *Attorney, Agent, or Firm* — WHDA, LLP

(57) ABSTRACT

The present disclosure is related to an array substrate. The array substrate may include a base substrate; a plurality or light-emitting devices on the base substrate; a photosensitive device between the light-emitting devices and the base substrate; and a refractive layer between the photosensitive device and the light-emitting devices. The refractive layer may be at a distance from the photosensitive device, and the refractive layer may cover at least a gap region between the adjacent light-emitting devices. A refractive index of the refractive layer may be larger than a refractive index of a film layer in the gap region between the refractive layer and the photosensitive device, and an orthographic protection of the photosensitive device on the base substrate may at least partially overlap an orthographic projection of the light-emitting devices on base substrate.

13 Claims, 10 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2018/0033835 A1 | 2/2018 | Zeng et al. | |
| 2018/0053032 A1* | 2/2018 | Ding | G06V 40/1318 |
| 2018/0060641 A1* | 3/2018 | Kim | G06V 40/13 |
| 2018/0068157 A1 | 3/2018 | Zeng et al. | |
| 2018/0076256 A1 | 3/2018 | Jiang et al. | |
| 2019/0025971 A1 | 1/2019 | Li et al. | |
| 2020/0044004 A1 | 2/2020 | Wang et al. | |
| 2020/0193126 A1 | 6/2020 | Shi et al. | |
| 2021/0233984 A1* | 7/2021 | Wang | H01L 27/3265 |

FOREIGN PATENT DOCUMENTS

| | | | |
|---|---|---|---|
| CN | 107092892 A | 8/2017 | |
| CN | 107230698 A | 10/2017 | |
| CN | 107368822 A | 11/2017 | |
| CN | 108376250 A | 8/2018 | |
| CN | 109034039 A | 12/2018 | |
| CN | 109065582 A | 12/2018 | |
| CN | 109521590 A | 3/2019 | |
| CN | 109801569 A | 5/2019 | |

OTHER PUBLICATIONS

English Machine Translation of CN 109034039 (Year: 2018).*
International Search Report dated Jan. 23, 2020, issued in counterpart application No. PCT/CN2019/114784 (13 pages).
Office Action dated Dec. 17, 2019, issued in counterpart CN application No. 201910242276.3, with English translation. (16 pages).

* cited by examiner

ARRAY SUBSTRATE AND FABRICATING METHOD THEREOF, AND DISPLAY APPARATUS

CROSS-REFERENCE TO RELATED APPLICATIONS

This application claims benefit of the filing date of Chinese Patent Application No. 201910242276.3 filed on Mar. 28, 2019, the disclosure of which is hereby incorporated in its entirety by reference.

TECHNICAL FIELD

The disclosure relates to the field of display technology, in particular, to an array substrate, a method of fabricating the array substrate, and a display apparatus.

BACKGROUND

With the development of display technology, people are increasingly pursuing full-screen display, so the research of fingerprint recognition technology under the screen is particularly important.

In the related art, in order to realize fingerprint recognition under the screen, a photosensitive element is disposed in the array substrate to collect reflected light of the fingerprint. However, since a light-shielding anode layer exists in each of the light-emitting devices in the array substrate, the external reflected light is partially blocked by the anode layer. Therefore, the photosensitive element can only be disposed at a gap between the light-emitting devices in the array substrate to obtain on optical signal to realize transmission and recognition of the fingerprint signal. However, in order to ensure the aperture ratio of the display panel, the area of the gap between the light-emitting devices in the array substrate is relatively small, which limits the light-receiving area of the photosensitive element and accordingly results in a weak fingerprint recognition signal.

BRIEF SUMMARY

An embodiment of the present disclosure provides an array substrate. The array substrate may include a base substrate, a plurality of light-emitting devices on the base substrate; a photosensitive device between the light-emitting devices and the base substrate; and a refractive layer between the photosensitive device and the light-emitting devices. The refractive layer may be at a distance from the photosensitive device, and the refractive layer may cover at least a gap region between the adjacent light-emitting devices. A refractive index of the refractive layer may be larger than a refractive index of a film layer in the gap region between the refractive layer and the photosensitive device, and an orthographic projection of the photosensitive device on the base substrate may at least partially overlap an orthographic protection of the light-entitling devices on base substrate.

Optionally, in a direction from the light emitting-devices to the base substrate, refractive indices of a plurality of film layers between the light-emitting devices and the photosensitive device are sequentially decreased.

Optionally, the photosensitive device is partially located in the gap region and partially under the light-emitting devices.

Optionally, the photosensitive device composes a first photosensitive element at a first distance from the refractive layer, and a second photosensitive element at a second distance from the refractive layer, wherein the first distance is smaller than the second distance.

Optionally, an orthographic projection of the first photosensitive element on the base substrate covers only the gap region, in orthographic projection of the second photosensitive element on the base substrate at least partially overlaps an orthographic projection of the light-emitting devices on the base substrate; and the first photosensitive element is connected in parallel with the second photosensitive element.

Optionally, the orthographic projection of the second photosensitive element on the base substrate is located partially in the gap region.

Optionally, the first distance ranges from about 0.5 µm to about 1 µm; and a vertical distance between the first photosensitive element and the second photosensitive element ranges from about 0.5 µm to about 1 µm.

Optionally, the array substrate further comprises: a read transistor between the second photosensitive element and the base substrate, wherein the first photosensitive element and the second photosensitive element each include an upper electrode and a lower electrode, wherein the lower electrode of the first photosensitive element and the lower electrode of the second photosensitive element are both connected to a source electrode of the read transistor, and the upper electrode of the first photosensitive element and the upper electrode of the second photosensitive element are both connected to a bias signal line.

Optionally, the array substrate further comprises: a first insulating layer between the first photosensitive element and the second photosensitive element, and a second insulating laser between the first photosensitive element and the refractive layer, wherein a refractive index of the second insulating layer is greater than a refractive index of the first insulating layer.

Optionally, the array substrate further comprises: a pixel defining layer on a side of the refractive layer opposite from the base substrate, wherein a refractive index of the pixel defining layer is greater than the refractive index of the second insulating layer.

Optionally, the refractive layer comprises: $Si_3N_4$ and/or an epoxy resin.

Optionally, the first photosensitive element and the second photosensitive element each comprise a photodiode.

Optionally, the light-emitting devices are a top emission type, and each of the light-emitting devices comprises an opaque anode.

One embodiment of the present disclosure is a method of fabricating an array substrate, comprising providing a base substrate; forming a photosensitive device on the base substrate; forming a refractive layer on the photosensitive device; and forming a plurality of light-emitting devices on the refractive layer; wherein an orthographic protection of the photosensitive device on the base substrate at least partially overlaps an orthographic protection of the light-emitting devices on the base substrate; the refractive layer covers at least a gap region between the adjacent light-emitting devices on a side of the photosensitive device opposite from the base substrate; and a refractive index of the refractive layer is larger than a refractive index of a film layer in the gap region between the refractive layer and the photosensitive device.

Optionally, the photosensitive device comprises a first photosensitive element and a second photosensitive element, forming the photosensitive device on the base substrate comprises forming the second photosensitive element on the base substrate, wherein the second photosensitive element is at least partially located below the light-emitting devices; forming a first insulating layer on a side of the second photosensitive element opposite from the base substrate; forming the first photosensitive element on a side of the first insulating layer opposite from the base substrate, wherein an orthographic projection of the first photosensitive element on the base substrate covers only the gap region; and forming a second insulating layer on a side of the first photosensitive element opposite from the base substrate, wherein a refractive index of the second insulating layer is greater than a refractive index of the first insulating layer.

Optionally, the method of fabricating an array substrate further comprises forming a pixel defining layer on a side of the refractive layer opposite from the base substrate, wherein a refractive index of the pixel defining layer is greater than the refractive index of the second insulating layer.

Optionally, the method of fabricating an array substrate further comprises forming a read transistor between the second photosensitive element and the base substrate, wherein the first photosensitive element and the second photosensitive element each include an upper electrode and a lower electrode, the lower electrode of the first photosensitive element and the lower electrode of the second photosensitive element are both connected to a source electrode of the read transistor, and the upper electrode of the first photosensitive element and the upper electrode of the second photosensitive element are both connected to a bias signal line.

One embodiment of the present disclosure is a display apparatus comprising the array substrate according to one embodiment of the present disclosure.

BRIEF DESCRIPTION OF THE DRAWINGS

The drawings are used to provide a further understanding of the technical solutions of the present disclosure, and constitute a part of the specification, which together with the embodiments of the present disclosure are used to explain the technical solutions of the present disclosure, and do not constitute a limitation of the technical solutions of the present disclosure. Obviously, the drawings in the following description are only some embodiments of the present disclosure, and those skilled in the art can obtain other drawings according to these drawings without any creative work.

DETAILED DESCRIPTION

Figure 1:
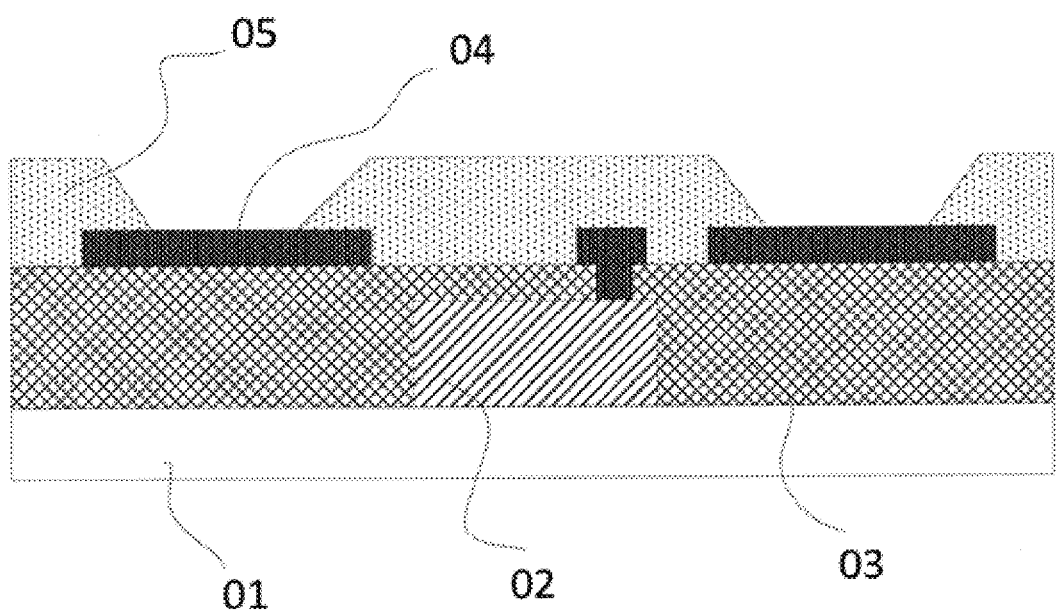
FIG. 1 is a schematic structural view of an array substrate in the related art.

In the related art, as shown in FIG. 1, in order to realize fingerprint recognition under a screen, photosensitive elements 02 are disposed in the array substrate to collect reflected light of a fingerprint. Specifically, a photosensitive element 02, an insulating layer pattern 03, anode layers 04 of light-emitting devices, and a pixel defining layer 05 are sequentially formed on a base substrate 01. Since a light-shielding anode laser 04 exists in each of the light-emitting devices on the base substrate 01, the externally reflected light is blocked to a certain extent by the anode layer. Therefore, the photosensitive element 02 can only be disposed at a gap between the light-emitting devices in the base substrate 01 to acquire an optical signal, thereby realizing transmission and recognition of the fingerprint signal. However in order to secure the aperture ratio of the display panel, the area of the gap between the respective light-emitting devices in the base substrate 01 is relatively small, which limits the light-receiving area of the photosensitive element 02 and accordingly results in a weak fingerprint identification signal.

Some embodiments of the present disclosure provide an array substrate, a method for fabricating the same, and a display apparatus. The present disclosure will be further described in detail with reference to the accompanying drawings. All other embodiments obtained by a person of ordinary skill in the art based on the embodiments of the present disclosure without creative efforts are within the protection scope of the present disclosure.

Although relative terms such as "above" and "below" are used in the specification to describe the relative relationship of one component to another component, these terms are used in this specification for convenience only, for example, in the accompanying drawings such that the direction of the example described. It is understandable that if the device of the icon is flipped upside down, the component described "above" will become the component "below". When a structure is "on" another structure, it may mean that a structure is integrally formed on another structure, or that a structure is "directly" disposed on another structure, or that a structure is "indirectly" disposed through another structure on other structures.

The terms "a," "an," "the," and "said" are used to mean presence of one or more elements/components, etc.; the terms "including" and "having" are used to mean the inclusiveness, meaning that there may be additional elements/components/etc. in addition to the listed elements/components/etc. In addition the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. A number modified by "about" herein means that the number can vary by 10% thereof.

Figure 2:
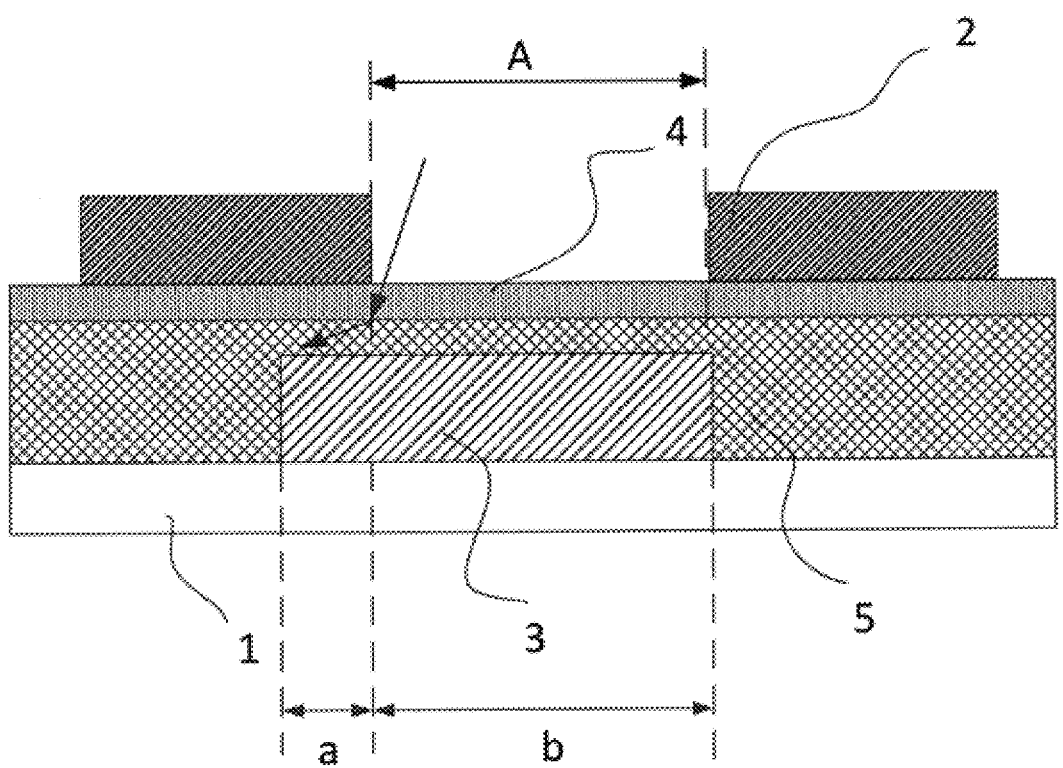
FIG. 2 is a schematic structural diagram of an array substrate according to one embodiment of the present disclosure.

One embodiment of the present disclosure provides an array substrate. As shown in FIG. 2, the array substrate includes: a base substrate 1, a plurality of top emission type light-emitting devices 2 disposed on the base substrate 1, a photosensitive device 3 located between the light-emitting devices 2 and the base substrate 1, and a refractive layer 4 between the photosensitive device 3 and the light-emitting devices 2 in a direction perpendicular to the base substrate.

In one embodiment, the refractive layer 4 has a pre-set distance from the photosensitive device 3, and the refractive layer 4 covers at least the gap region A between the respective light-emitting devices 2. The refractive index of the refractive layer 4 is larger than the refractive index of the film layer or the film layers in the gap region A on a side of the refractive layer facing the base substrate. The "distance" between two objects herein refers to a shortest distance in a direction perpendicular to the base substrate.

In one embodiment, an orthographic projection of the photosensitive device 3 on the base substrate at least partially overlaps an orthographic projection of the light-emitting devices 2 on the base substrate 1.

Wherein, the light-emitting device 2 comprises an anode, a light-emitting layer and a cathode which are sequentially disposed on the base substrate. The light-emitting device in the present disclosure may be a top emission type light-emitting device, and the top emission type light-emitting device means that the anode is an opaque layer. Also, the area where the light emitting device is located refers to the area where the anode is located, and the gap region refers to the area between the anode layers of two adjacent light-emitting devices.

Since a refractive layer with a high refractive index is disposed between the photosensitive device and the light-emitting devices, the exiting angle of the refracted light can be made larger than the incident angle of the externally reflected light. That is, the irradiation area of the external light can be made larger, so that the area of the photosensitive device can be set larger than that of the photosensitive device in the related art. Thus, the photosensitive device can be located partially in a region where the light-emitting device is located and partially in a gap region between the respective light-emitting devices, thereby improving the light-receiving area of the photosensitive device without reducing the aperture ratio.

In one array substrate provided by one embodiment of the present disclosure, the array substrate includes: a base substrate, a plurality of top emission type light-emitting devices disposed on the base substrate, a photosensitive device located between the light-emitting devices and the base substrate, and a refractive layer between the photosensitive device and the light-emitting devices. The refractive layer has a pre-set distance from the photosensitive device, and the refractive layer covers at least the gap region between the respective light-emitting devices. The refractive index of the refractive layer is larger than the refractive index of the adjacent film layer or layers, which is located between the base substrate and the refractive layer in the gap region. An orthographic projection of the photosensitive device on the base substrate at least partially overlaps an orthographic projection of the light-emitting devices on the base substrate. By disposing a refractive layer with a high refractive index between the photosensitive device and the light-emitting devices, the irradiation area of the external light on the photosensitive device can be made larger, so that a portion of the photosensitive device can be located in a region where the light-emitting device is located. Therefore, the light-receiving area of the photosensitive device is increased, thereby increasing intensity of the output signal of the photosensitive device.

Taking 5.46 FHD as an example, the area percentage of the light-emitting devices to the display area is 65%, and the area percentage of the photosensitive devices to the display area is 15%. By disposing some photosensitive devices under the light-emitting devices, the total area percentage of the photosensitive devices to the display area can be increased from 15% to 80%.

In addition to the above-mentioned embodiment by disposing a refractive layer to increase the angle of refraction to increase the light-receiving area of the photosensitive device, due to a narrow gap exists between the photosensitive device and the light-emitting devices, light can be diffracted by the narrow gap into the photosensitive device.

Optionally, in one array substrate provided by one embodiment of the present disclosure, the refractive index of each film layer between the light-emitting devices and the photosensitive device can be set sequentially decreased in a direction from the light-emitting device to the base substrate.

In one array substrate provided by one embodiment of the present disclosure, the refractive index of each film layer between the light-emitting devices and the photosensitive device is set to be sequentially decreased. Every time the light incident from the edges of the anode layer is refracted, the irradiation area under the light-emitting devices by the refracted light is increased by a certain area, so that the light incident from the edges of the anode layer can irradiate the photosensitive device to the maximum extent, thereby increasing the light-receiving area of the photosensitive device.

Optionally, in the array substrate provided by one embodiment of the present disclosure, as shown in FIG. 2, a portion of the photosensitive device 3 (region b) is located in the gap region A, and a portion of the photosensitive device 3 (region a) is located below the light emitting devices 2.

In one array substrate provided by one embodiment of the present disclosure, since the area under the light-emitting devices is larger than the area of the gap region, all the photosensitive elements may be located under the light-emitting devices. Such arrangement may increase the light-receiving area of the photosensitive device. Of course, the photosensitive device may be located under the photosensitive devices and within the gap region, thereby further increasing live light-receiving area of the photosensitive device.

Optionally, in one array substrate provided by one embodiment of the present disclosure, the orthographic projection of the photosensitive device on the base substrate can completely cover the gap region to maximize the irradiation area of the external light passing through the gap region on the photosensitive device.

Figure 3:
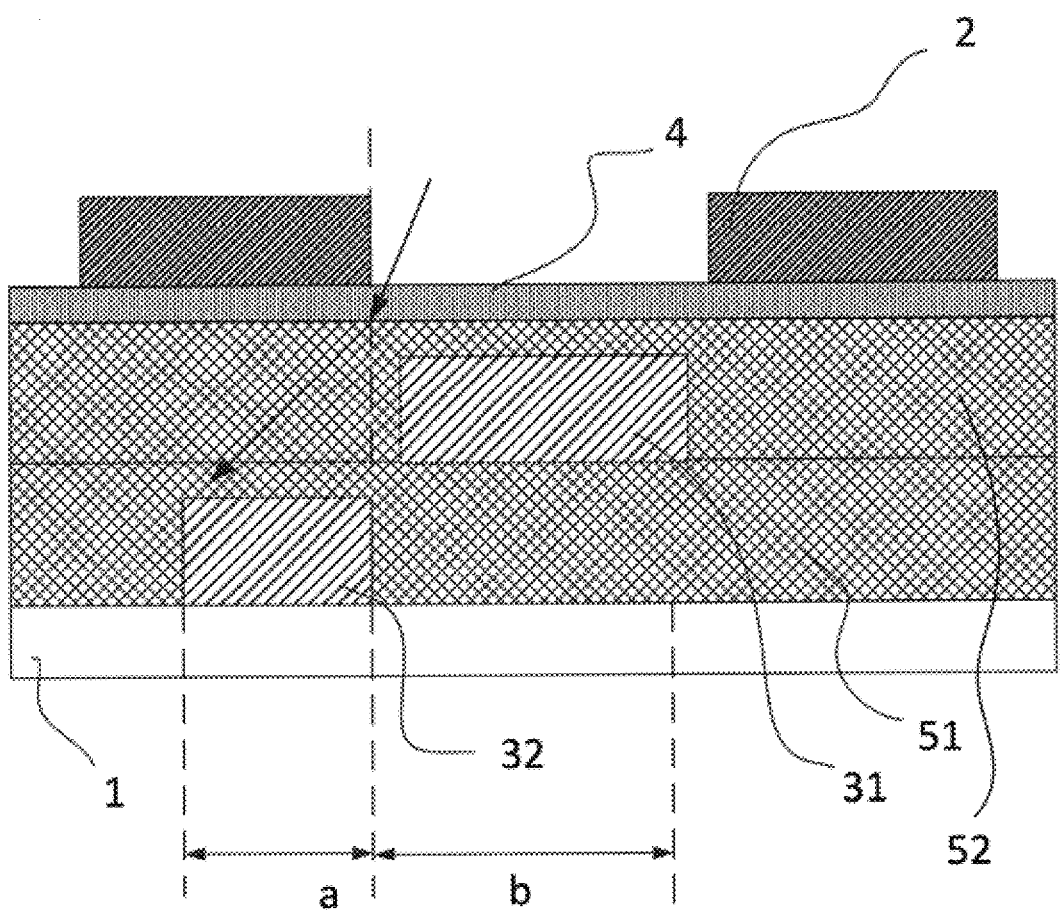
FIG. 3 is a schematic structural diagram of an array substrate according to one embodiment of the present disclosure.

Optionally, in one array substrate provided by one embodiment of the present disclosure, as shown in FIG. 3, the photosensitive device includes: a first photosensitive element 31 at a first predetermined distance from the refractive layer 4, and a second photosensitive element 32 at a second predetermined distance with the refractive layer 4, wherein the first predetermined distance is less than the second predetermined distance;

In one embodiment, the orthographic projection of the first photosensitive element 31 on the base substrate 1 covers only the gap region (region b), and the second photosensitive element 32 is at least partially located below the light emitting device (region a).

In one embodiment, the first photosensitive element 31 and the second photosensitive element 32 are connected in parallel.

In one array substrate provided by one embodiment of the present disclosure, the first photosensitive element and the second photosensitive element are disposed in different layers, and the second photosensitive element is further away from the refractive layer, thereby increasing the propagation path of the refracted light. Thus, the irradiation area of the refracted light on the second photosensitive element is larger. Because of the parallel connection of the first photosensitive element and the second photosensitive element, the sum of the electrical signals convened by the first photosensitive element and the second photosensitive element can be used as the induction signal. Therefore the strength of the signal is effectively increased.

Taking the distance of the second photosensitive element to the refraction layer of 2 μm and a refraction angle of 45° as an example, the first photosensitive element and the second photosensitive element are disposed relatively perpendicularly in contrast to the same layer arrangement. As such, the light-receiving area of the second photosensitive device can be doubled.

Figure 4:
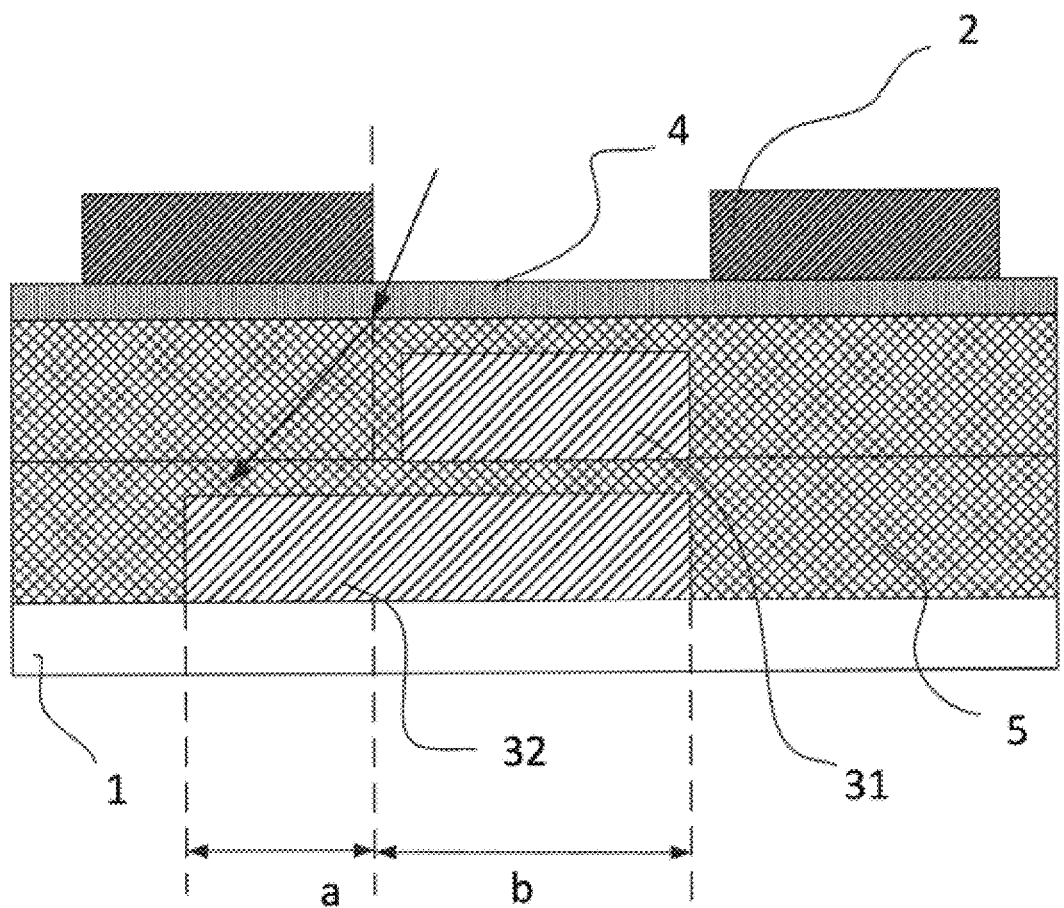
FIG. 4 is a schematic structural diagram of an array substrate according to one embodiment of the present disclosure.

Optionally, in one array substrate provided by one embodiment of the present disclosure, as shown in FIG. 4, the orthographic projection of the second photosensitive element on the base substrate is also located partially in the gap region.

Optionally, in one array substrate provided by one embodiment of the present disclosure, a portion of the second photosensitive element may be located at the gap region. Thus, the second photosensitive element may absorb light that is not completely absorbed by the first photosensitive element, thereby increasing utilization of light and further increasing the strength of the signal.

Optionally, in one array substrate provided by one embodiment of the present disclosure, the orthographic projection of the second photosensitive element on the base substrate may cover the orthographic projection of the first photosensitive element on the base substrate, so that the unabsorbed light by the first photosensitive element can be completely absorbed by the second photosensitive element.

Optionally, in one array substrate provided by one embodiment of the present disclosure, the first predetermined distance ranges from about 0.5 μm to about 1 μm.

Optionally, the vertical distance between the first photosensitive element and the second photosensitive element ranges from about 0.5 μm to about 1 μm.

Optionally, in one array substrate provided by one embodiment of the present disclosure, increasing the distance from the first photosensitive element and/or the second photosensitive element to the refractive layer can increase the propagation path of the refracted light, thereby increasing the light-receiving area of the second photosensitive element. However, as the interlayer distance increases, the thicker the interlayer thickness, the greater the loss of refracted light propagation between the layers. Thus, the distance between the first photosensitive element and the refractive layer and the distance between the first photosensitive element and the second photosensitive element are set to within the range of about 0.5 μm to about 1 μm, which ensures that the area of the second photosensitive element receives light and also reduces the loss of light in the interlayer medium.

Figure 5:
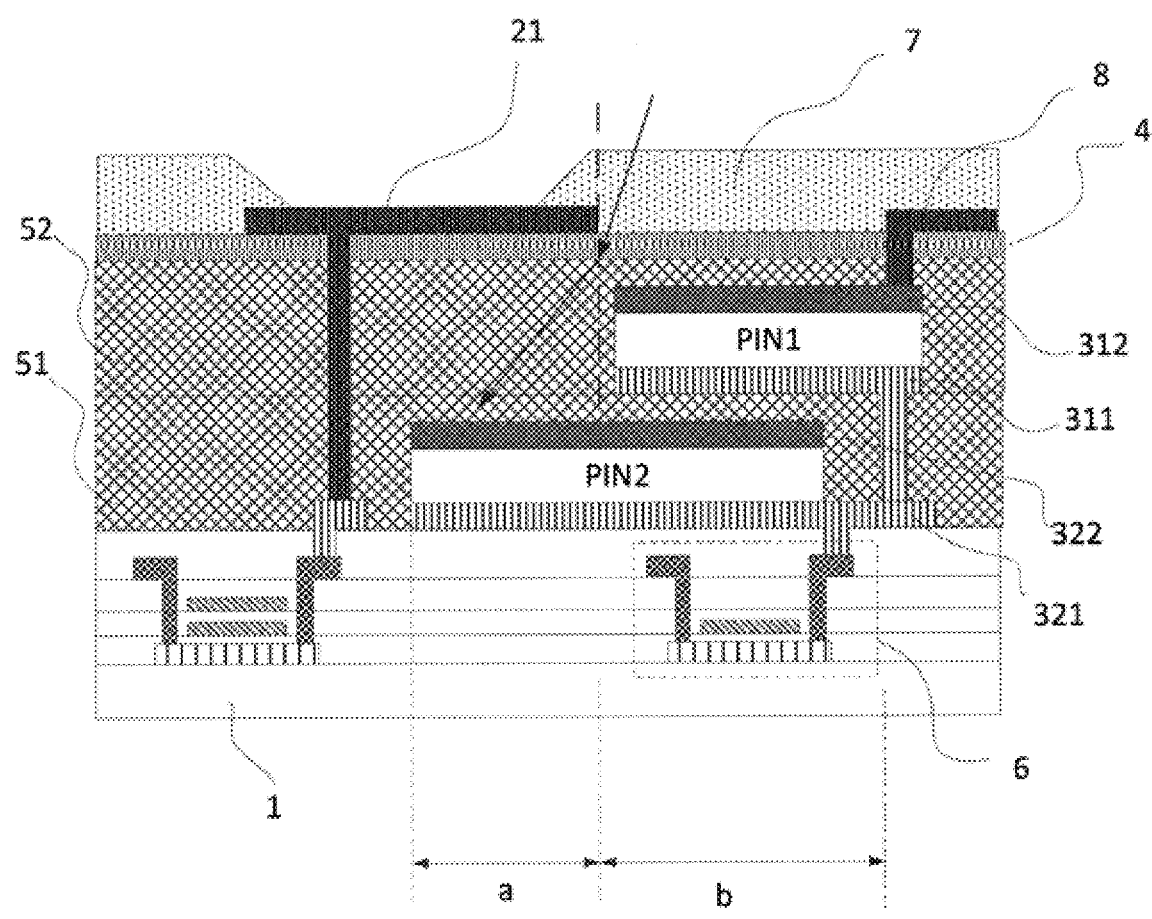
FIG. 5 is a schematic structural diagram of an array substrate according to one embodiment of the present disclosure.
Figure 6:
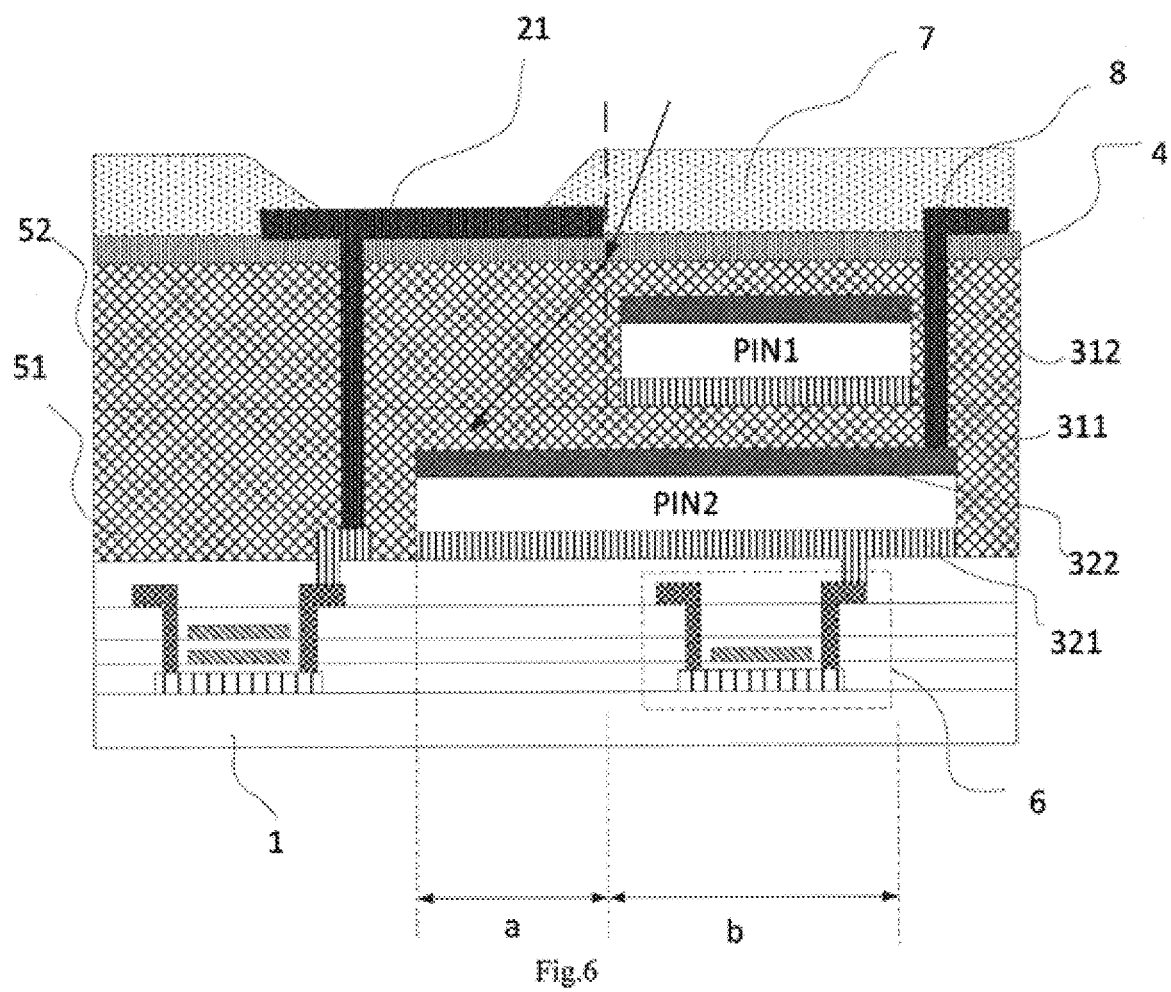
FIG. 6 is a schematic structural diagram of an array substrate according to one embodiment of the present disclosure.

Optionally, an array substrate provided by one embodiment of the present disclosure, as shown in FIG. 5 and FIG. 6, further comprises: a read transistor between the second photosensitive element 32 and the base substrate 1. The first photosensitive element 31 and the second photosensitive element 32 each include an upper electrode (312/322) and a lower electrode (311/321).

The lower electrode 311 of the first photosensitive element 31 and the lower electrode 321 of the second photosensitive element 32 are both connected to the source electrode of the read transistor.

The upper electrode 312 of the first photosensitive element 31 and the upper electrode 322 of the second photosensitive element 32 are both connected to the bias signal line 8.

In one array substrate provided by one embodiment of the present disclosure, the bias signal line 8 may be disposed in the same layer as the anode layer 21 of the light-emitting device; and a pixel defining layer 7 is further disposed on a side of the anode layer opposite from the base substrate to define the position of other film layers (not specifically shown in the drawing) of the light-emitting device. The first photosensitive element and the second photosensitive element each further include a PIN between the upper electrode and the lower electrode to achieve photoelectric conversion in addition to the upper electrode and the lower electrode.

The thickness of the upper electrode and the lower electrode of the first photosensitive element and the second photosensitive element each may be within a range of about 40 nm to about 70 nm.

It should be noted that, in FIG. 5, only the upper electrode 312 of the first photosensitive element PIN1 is connected to the bias signal line 8, but the upper electrode 322 and the bias signal line 8 of the second photosensitive device PIN1 are not shown. In the actual setting process, the first photosensitive device and the second photosensitive device and the bias signal line are connected at different positions. As shown in FIG. 6, the upper electrode 322 of the second photosensitive element PIN2 is connected with the bias signal line 8 through a via hole. FIG. 5 and FIG. 6 respectively show cross-sectional views at different positions of the array substrate.

Optionally, an array substrate provided by one embodiment of the present disclosure, as shown in FIG. 5 and FIG. 6, it further includes: a first insulating layer 51 located between the first photosensitive element 31 and the second photosensitive element 32, and a second insulating layer 52 between the first photosensitive element 31 and the refractive layer 4, wherein the refractive index of the pixel defining layer 7 is greater than the refractive index of the refractive layer 4, and the refractive index of the refractive layer 4 is greater than the refractive index of the second insulating layer 52.

Optionally, in one array substrate provided by one embodiment of the present disclosure, when the refractive index of the second insulating layer is different from the refractive index of the first insulating layer, the light emitted through the refractive layer will be refracted again at the interface between the first insulating layer and the second insulating layer. When the refractive index of the second insulating layer is greater than the refractive index of the first insulating layer, the incident angle of the incident light will be smaller at the interface between the first insulating layer and the second insulating layer than the refraction angle of the refracted light, thereby increasing the range of irradiation, that is, increasing the light-receiving area of the second photosensitive element.

Optionally, in one array substrate provided by one embodiment of the present disclosure, as shown in FIG. 5, it further comprises: a pixel defining layer 7 on the side of the refractive layer 4 opposite from the base substrate 1, wherein the refractive index of the pixel defining layer 7 is greater than the refractive index of the second insulating layer 52.

In one array substrate provided by one embodiment of the present disclosure, when the refractive index of the pixel defining layer is greater than the refractive index of the second insulating layer, the difference between the refraction angle and the incident angle is greater compared to when the refractive index of the pixel defining layer and the second insulating layer are the same. That is, when the refractive index of the pixel defining layer is greater than the refractive index of the second insulating layer, the angle of the refraction can be increased, thereby increasing the light-receiving area of the second photosensitive element. Wherein, the thickness of the pixel defining layer could be within a range of about 1.5 μm to about 2 μm.

Optionally, in one array substrate provided by one embodiment of the present disclosure, the material of the refractive layer comprises: $Si_3N_4$ and/or an epoxy resin.

Of course, the material of the refractive layer provided by the embodiment of the present disclosure is not limited thereto, and may be any other high refractive index material capable of realizing the function of the present disclosure, and is selected according to actual use, and is not specifically limited herein.

Optionally, in one array substrate provided by the embodiment of the present disclosure, the photosensitive element comprises a photodiode. The photodiode may include an upper electrode, a lower electrode and a PIN junction.

Figure 7A:
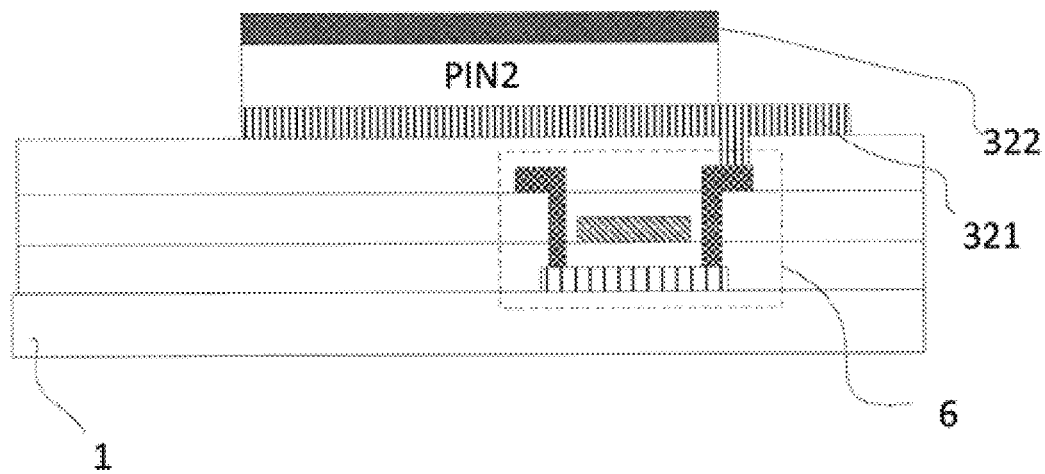
FIGS. 7a-7e are schematic structural diagrams of a method for fabricating an array substrate according to one embodiment of the present disclosure.

The following describes the fabrication process of the array substrate by taking the structure of the array substrate shown in FIG. 5 as an example, as follows:

As shown in FIG. 7a, a second photosensitive element 32 is formed on the base substrate 1 on which the read transistor 6 is formed (including sequentially forming a lower electrode 321 on the side of the read transistor 6 opposite from the base substrate 1, a PIN2 structure and an upper electrode 322), wherein a transistor for driving the light-emitting device is further disposed between the second photosensitive element 32 and the base substrate 1. Each film layer of the transistor for driving the light-emitting device may be disposed in the same layer as each film layer of the read transistor 6. In addition, the transistor for driving the light-emitting device may further include two gate electrodes and an insulating layer between the two gate electrodes, and an orthographic projection of the two gate electrodes on the base substrate 1 has an overlapping area, thereby forming a capacitance. The process and principle of forming a read transistor are the same as those of forming a transistor in the related art, and are not described herein again.

In one embodiment, forming the PIN2 structure includes sequentially depositing N (n-type Si), I (intrinsic Si), and P (p-type silicon) layers, wherein the thickness of the N layer is about 20 nm to about 50 nm, the thickness of the I layer is about 500 nm to about 900 nm, and the thickness of P layer is about 5 nm to about 50 nm.

Figure 7B:
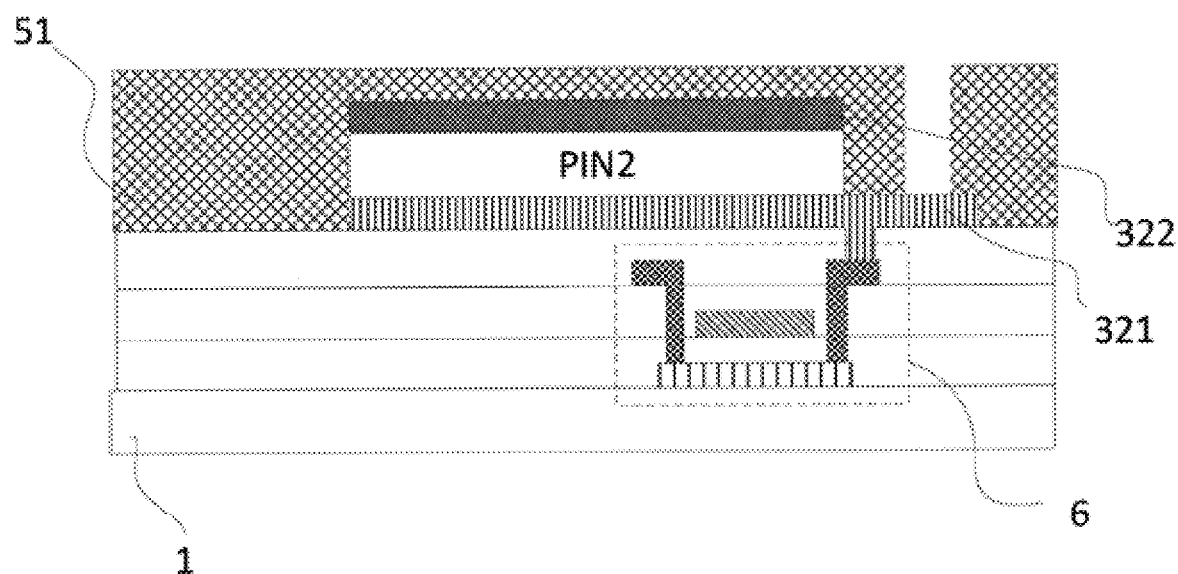

As shown in FIG. 7b, a pattern of the first insulating layer 51 is formed on the side of the second photosensitive element 32 opposite from the base substrate 1, wherein the thickness of the first insulating layer is about 1.5 μm to about 2.5 μm, which ensures that the flatten structure of the PIN2.

Figure 7C:
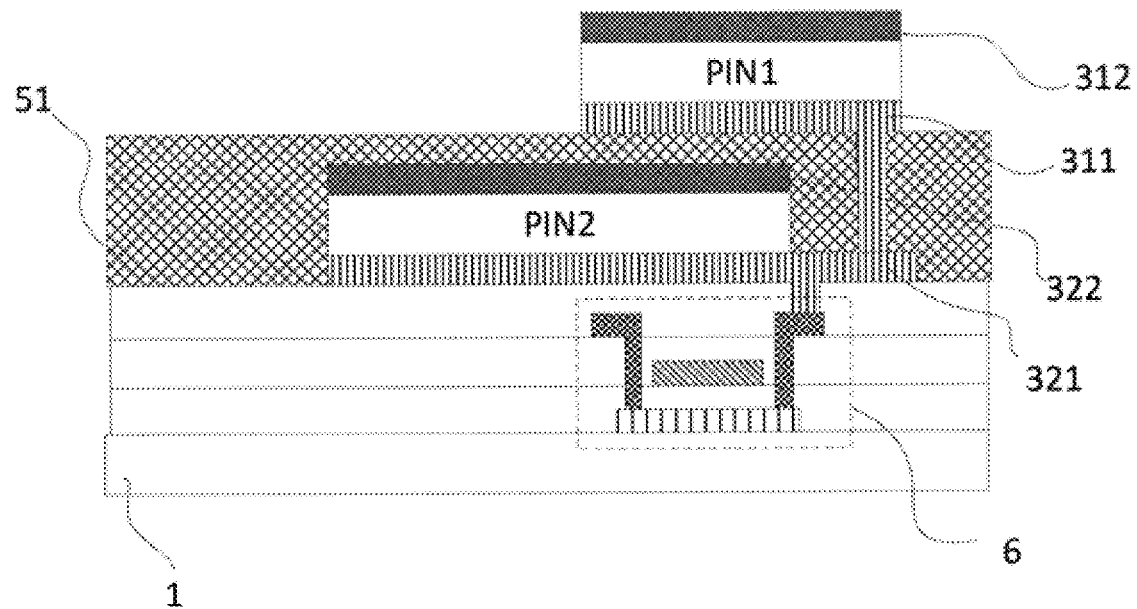

As shown in FIG. 7c, the first photosensitive element 31 is formed on the side of the pattern of the first insulating layer 51 opposite front the base substrate 1 (including sequentially forming the lower electrode 311, PIN1 structure and upper electrode 312 on the side of the pattern of the first insulating layer 51 opposite from the base substrate 1).

Figure 7D:
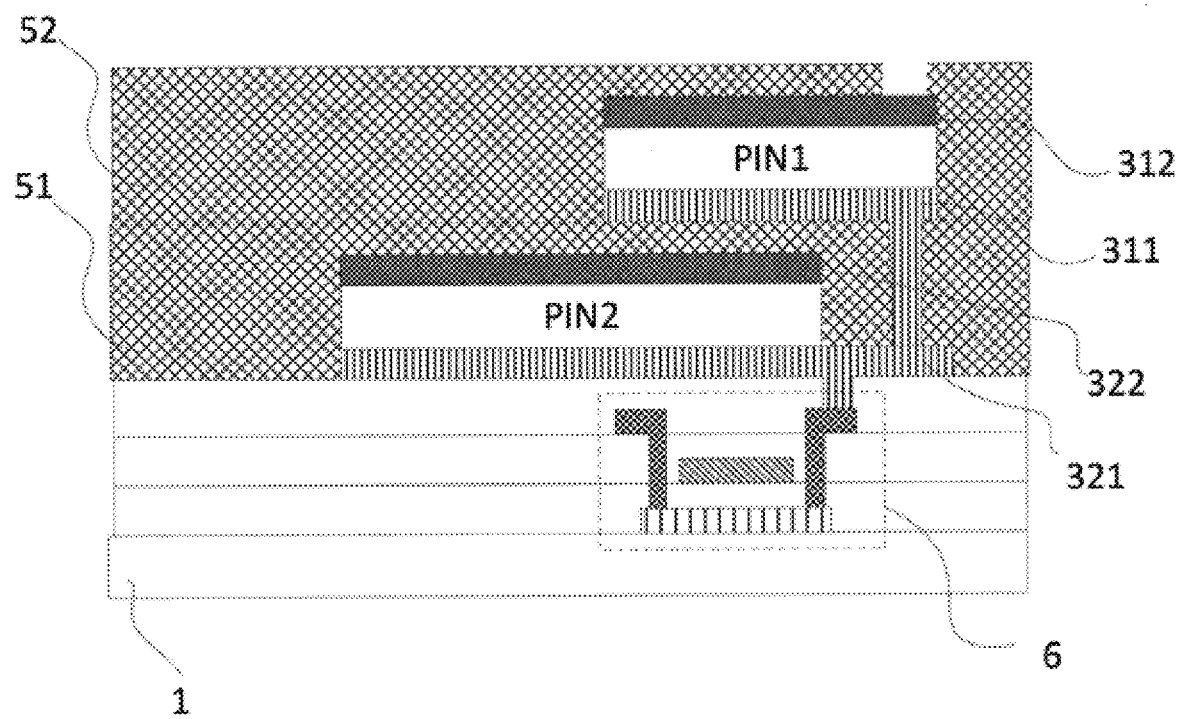

As shown in FIG. 7d, a pattern of the second insulating layer 52 is formed on the side of the first photosensitive element 31 opposite from tire base substrate 1, wherein the thickness of the second insulating layer is about 1.5μ to about 2.5 μm, which ensures that the flatten structure of the PIN1.

Figure 7E:
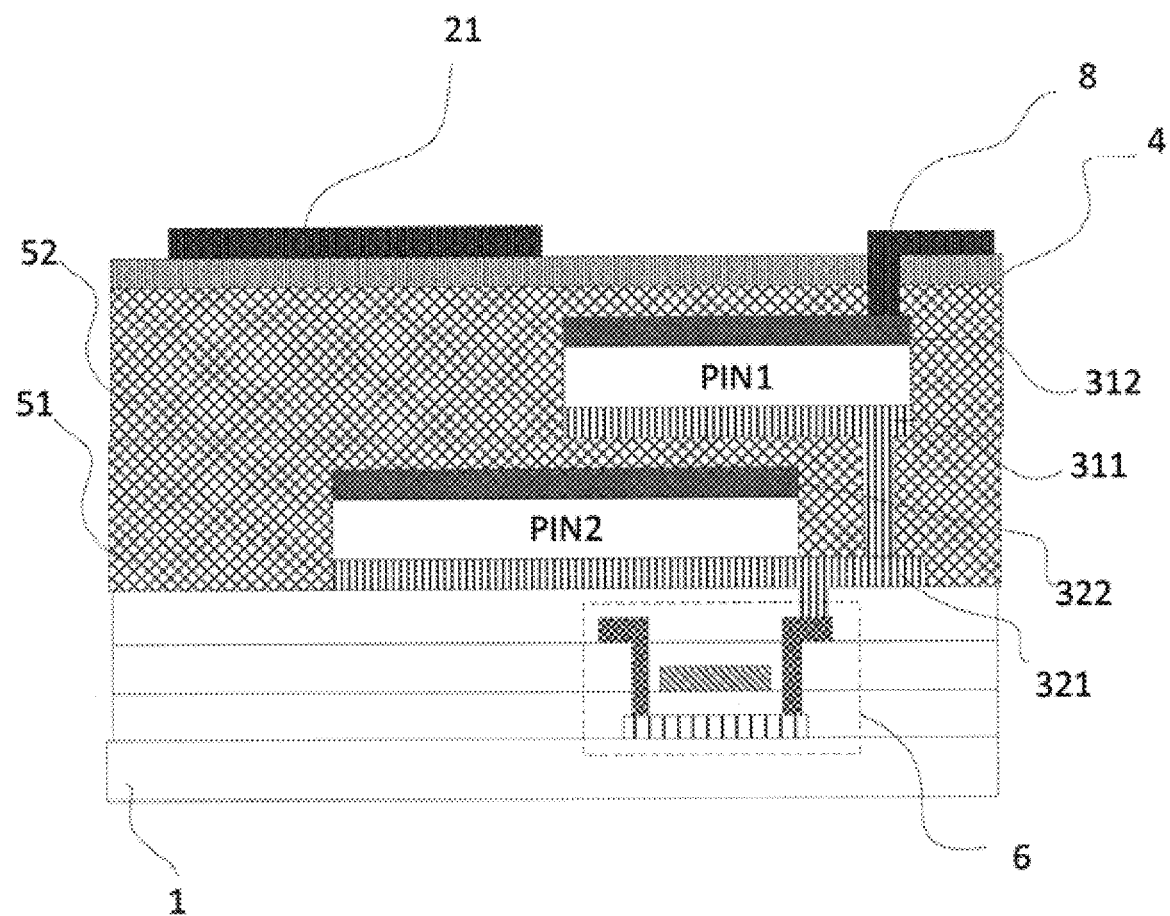

As shown in FIG. 7e, the anode layer 21 of the light-emitting device and the bias signal line 8 are formed on the side of the second insulating layer 52 opposite from the base substrate 1, wherein the bias signal line 8 and the anode layer 21 of the light-emitting device may be formed through one patterning process.

Then, a pattern of the pixel defining layer 7 is formed on the side of the anode layer 21 opposite from the base substrate 1, thereby forming an array substrate as shown in FIG. 5. After forming the pattern of the pixel defining layer, other layers of the light-emitting device in the pixel region, for example, an organic light-emitting layer, a cathode layer, and etc. are formed.

Based on the same inventive concept, an embodiment of the present disclosure further provides a method for fabricating an array substrate, comprising:

providing a substrate;

forming a photosensitive device on thee base substrate, wherein a portion of the photosensitive device is located in a gap region between the respective light-emitting devices, and a portion of the photosensitive device is partially located under the light emitting device;

forming a refractive layer covering at least the gap region on a side of the photosensitive device opposite from the substrate, wherein the refractive layer has a certain distance from the photosensitive device, and the refractive index of the refractive layer is greater than the refractive index of the adjacent film layer in the gap region.

Optionally, in one method for fabricating the array substrate provided by one embodiment of the present disclosure, when the photosensitive device includes the first photosensitive element and the second photosensitive element, the method includes:

forming a second photosensitive element on the base substrate, wherein the second photosensitive element is at least partially located below the light-emitting devices;

forming a pattern of the first insulating layer on a side of the second photosensitive element opposite from the base substrate;

forming a first photosensitive element on a side of the first insulating layer opposite from the base substrate, wherein an orthographic projection of the first photosensitive element on the base substrate covers only the gap region;

forming a pattern of a second insulating layer on a side of the first photosensitive element opposite from the base substrate; and forming a refractive layer on a side of the second insulating layer opposite from the base substrate.

The method for fabricating the array substrate has been described in the embodiments of the structure of the array substrate. The principle and process of the method for fabricating the array substrate are the same as those mentioned in the above embodiments of the array substrate. The method for fabricating the array substrate can be implemented by referring to the embodiments of the array substrate described above, and the details thereof are not described herein again.

Figure 8:
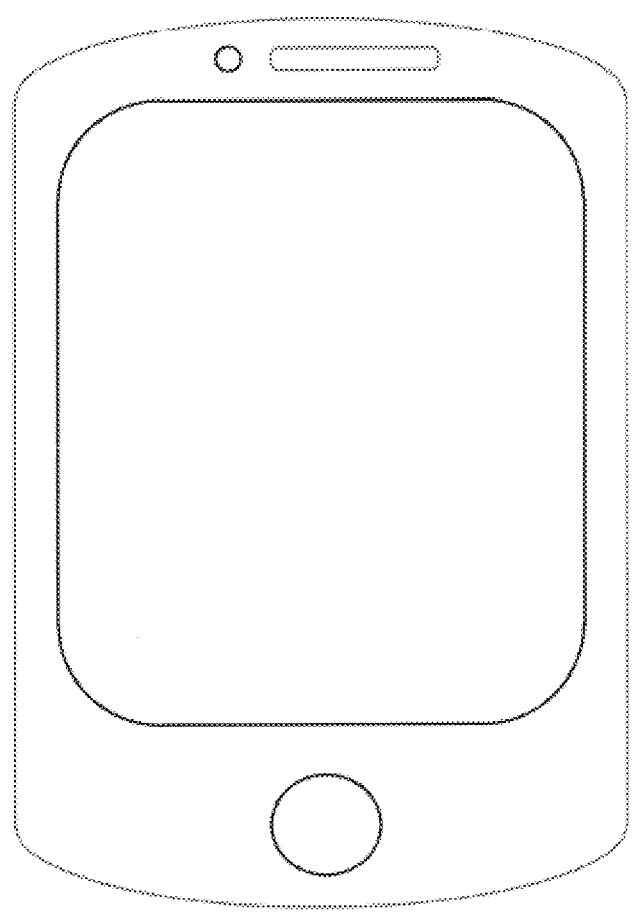
FIG. 8 is a schematic structural diagram of a display apparatus according to one embodiment of the present disclosure.

Based on the same inventive concept, as shown in FIG. 8, an embodiment of the present disclosure further provides a display apparatus, including an array substrate in any of the above embodiments. Since the principle of solving the problem of the display apparatus is similar to that of the foregoing array substrate, the implementation of the display apparatus can be referred to the implementation of the foregoing array substrate, and the repeated description is omitted herein.

The display apparatus is applicable to various types of displays such as an organic electroluminescence display, an inorganic electroluminescence display, and an active Matrix/Organic Light Emitting Diode (AMOLED). The display apparatus may be any product or component having a display function, such as a mobile phone, a tablet computer, a television, a display, a notebook computer, a digital photo frame, a navigator, and the like, which is not limited herein.

The embodiment of the present disclosure provides an array substrate, a method of fabricating array substrate, and a display apparatus. The array substrate includes: a base substrate, a plurality of top emission type light-emitting devices disposed on the base substrate, a photosensitive device located between the light-emitting devices and the base substrate, and a refractive layer between the photosensitive device and the light-emitting devices. The refractive layer has a pre-set distance from the photosensitive device, and the refractive layer covers at least the gap region between the respective light-emitting devices. The refractive index of the refractive layer is larger than the refractive index of the adjacent film layer or layers, which are located in the gap region between the base substrate and the refractive layer. In one embodiment, an orthographic projection of the photosensitive device on the base substrate at least partially overlaps with an orthographic projection of the light-emitting devices on the base substrate. By disposing a refractive layer with a high refractive index between the photosensitive device and the light-emitting devices, the irradiation area of the external light on the photosensitive device can be made larger, so that a portion of the photosensitive device can be located in a region where the light-emitting devices are located. Therefore the light-receiving area of the photosensitive device is increased, and also the intensity of the output signal of the photosensitive device is increased.

It is apparent that those shilled in the art can make various modifications and variations to the present disclosure without departing from the spirit and scope of the present disclosure. Thus, it is intended that the present disclosure covers the modifications and variations to the present disclosure.

What is claimed is:

1. An array substrate, comprising:
   a base substrate;
   a plurality of light-emitting devices on the base substrate;
   a photosensitive device between the light-emitting devices and the base substrate; and
   a refractive layer between the photosensitive device and the light-emitting devices,
   wherein each of the light-emitting devices includes an anode, and the anode is opaque;
   the refractive layer is at a distance from the photosensitive device, the refractive layer covers at least a gap region between adjacent light-emitting devices, the gap region is an area between anodes of the adjacent light-emitting devices, and the photosensitive device is configured to detect light passing through the gap region;
   a refractive index of the refractive layer is larger than a refractive index of a film layer in the gap region between the refractive layer and the photosensitive device; and
   an orthographic projection of the anode on the base substrate at least partially overlaps an orthographic projection of the light-emitting devices on base substrate.

2. The array substrate according to claim 1, wherein in a direction from the light emitting-devices to the base substrate, refractive indices of a plurality of film layers between the light-emitting devices and the photosensitive device are sequentially decreased.

3. The array substrate according to claim 1, wherein the photosensitive device is partially located in the gap region and partially under the light-emitting devices.

4. The array substrate according to claim 3, wherein the photosensitive device comprises: a first photosensitive element at a first distance from the refractive layer, and a second photosensitive element at a second distance from the refractive layer, wherein the first distance is smaller than the second distance, and the first photosensitive element and the second photosensitive element are located at different layers.

5. The array substrate according to claim 4, wherein an orthographic projection of the first photosensitive element on the base substrate covers only the gap region, an orthographic projection of the second photosensitive element on the base substrate at least partially overlaps an orthographic projection of the light-emitting devices on the base substrate; and the first photosensitive element is connected in parallel with the second photosensitive element.

6. The array substrate according to claim 5, wherein the orthographic projection of the second photosensitive element on the base substrate is located partially in the gap region.

7. The array substrate according to claim 4, wherein the first distance ranges from about 0.5 μm to about 1 μm; and a vertical distance between the first photosensitive element and the second photosensitive element ranges from about 0.5 μm to about 1 μm.

8. The array substrate according to claim 4, further comprising: a read transistor between the second photosensitive element and the base substrate,
   wherein the first photosensitive element and the second photosensitive element each include an upper electrode and a lower electrode, wherein the lower electrode of the first photosensitive element and the lower electrode of the second photosensitive element are both connected to a source electrode of the read transistor, and the upper electrode of the first photosensitive element and the upper electrode of the second photosensitive element are both connected to a bias signal line.

9. The array substrate according to claim 4, further comprising: a first insulating layer between the first photosensitive element and the second photosensitive element, and a second insulating layer between the first photosensitive element and the refractive layer,
   wherein a refractive index of the second insulating layer is greater than a refractive index of the first insulating layer.

10. The array substrate according to claim 9, further comprising: a pixel defining layer on a side of the refractive layer opposite from the base substrate, wherein a refractive index of the pixel defining layer is greater than the refractive index of the second insulating layer.

11. The array substrate according to claim 1, wherein the refractive layer comprises: $Si_3N_4$ and/or an epoxy resin.

12. The array substrate according to claim 4, wherein the first photosensitive element and the second photosensitive element each comprise a photodiode.

13. The array substrate according to claim 1, wherein the light-emitting devices are a top emission type.

\* \* \* \* \*